United States Patent [19]

Jackson

[11] Patent Number: 4,872,040
[45] Date of Patent: Oct. 3, 1989

[54] SELF-ALIGNED HETEROJUNCTION TRANSISTOR

[75] Inventor: Thomas N. Jackson, Peekskill, N.Y.

[73] Assignee: International Business Machines Corporation, Armonk, N.Y.

[21] Appl. No.: 41,812

[22] Filed: Apr. 23, 1987

[51] Int. Cl.[4] ............................................. H01L 29/72
[52] U.S. Cl. ...................................... 557/16; 357/34; 357/63; 357/91
[58] Field of Search ........................ 357/16, 34, 63, 91

[56] References Cited

U.S. PATENT DOCUMENTS

| | | | |
|---|---|---|---|
| 4,119,994 | 10/1978 | Jain et al. | 357/16 |
| 4,380,774 | 4/1983 | Yoder | 357/16 |
| 4,381,953 | 5/1983 | Ho et al. | 148/1.5 |
| 4,385,198 | 5/1983 | Rahilly | 136/249 |
| 4,395,722 | 7/1983 | Esaki et al. | 357/16 |
| 4,482,906 | 11/1984 | Hovel et al. | 357/16 |
| 4,573,064 | 2/1986 | McLevige et al. | 357/16 |
| 4,586,071 | 4/1986 | Tiwari | 357/34 |
| 4,593,305 | 6/1986 | Kurata et al. | 357/34 |
| 4,596,070 | 6/1986 | Bayraktaroglu | 29/571 |
| 4,599,791 | 7/1986 | Focht et al. | 29/576 B |
| 4,649,411 | 3/1987 | Birrittella | 357/36 |
| 4,679,305 | 7/1987 | Morizuka | 357/16 |
| 4,683,487 | 7/1987 | Ueyanagi et al. | 357/34 |

FOREIGN PATENT DOCUMENTS 2719464 12/1978 Fed. Rep. of Germany ........ 357/34
0130774 6/1984 Japan .
0197424 3/1986 Japan .

OTHER PUBLICATIONS

H. Kroemer, "Heterostructure Bipolar Transistors and Integrated Circuits", Proceedings of the IEEE, vol. 70, No. 1 (Jan. 1982).
IBM Technical Disclosure Bulletin, vol. 24, No. 7A, p. 3229, "Heterostructure Long Lifetime Hot Electron Transistor", by Dumke et al.
Invited Paper Conference Proceedings of the International Conference on the Physics and Chemistry of Semiconductor Heterojunctions and Layer Structures, Budapest, Hungary (1970) "ZnSe-GaAs and ZnSe-Ge Heterojunction Transistors", by Sleger et al.

Primary Examiner—Andrew J. James
Assistant Examiner—David Soltz
Attorney, Agent, or Firm—Riddles Alvin J.; Bernard E. Shay

[57] ABSTRACT

A vertical heterojunction equal area transistor and starting structure therefor is provided in which three epitaxial layers structure with wide band gap external layers and narrower band gap center layer is provided with peripheral impurity concentrations such that the area around the wide gap electrodes is high resistivity and the area around the center narrower gap region is high conductivity. A bipolar transistor of GaAs-Ge-GaAs is described.

11 Claims, 2 Drawing Sheets

4,872,040

SELF-ALIGNED HETEROJUNCTION TRANSISTOR

DESCRIPTION

1. Field of the Invention

The field of the invention is in heterojunction transistors wherein the emitter, base and collector regions are of different semiconductor materials. Such devices usually have at least one region of a compound semiconductor material. They have advantages in performance and in simplification in fabrication due to differences in response by the different materials.

2. Background Art

One type of heterojunction transistor known in the art has the compound semiconductor gallium arsenide (GaAs) for the emitter and collector regions and has the elemental semiconductor Ge for the base region. In that structure, described in the IBM Technical Disclosure Bulletin, Vol. 24, No. 7A, December 1981, pages 3229, 3230 and 3231, the wider band gap property of the GaAs provides hot electron carrier transport in the elemental Ge base region.

Devices of that type, however, require careful procedures in fabrication to insure predictable and reproducible high speed response.

Alignment techniques have been developed in the art in which a crystal body having a plurality of layers of different type of semiconductor materials parallel with a surface employ a material that serves as a bombardment mask placed in contact with that surface. In this type of alignment technique, a bombardment from a direction that is vertical with respect to the surface around the masked area produces material changes in the layers that are laterally positioned and self-aligned by the mask. Such a technique is shown in U.S. Pat. No. 4,599,791.

As the art has progressed in the direction of more precise electrical response, physical shape and size, and interconnectability specifications; electrical capacitance, interconnectability due to different region sizes and limitations on available materials due to process temperature excursions have limited ability in the art to meet those specifications.

DISCLOSURE OF THE INVENTION

In accordance with the invention, a vertical heterojunction transistor, intermediate transistor manufacturing product and a manufacturing process is provided. The intermediate manufacturing product structure is made up of three epitaxial layers of alternating wide band gap, narrower band gap and wide band gap semiconductor materials with the common property of being differently responsive to the presence of the same element as a conductivity type determining impurity. In other words, an impurity that produces, for example, p conductivity type in the wide band gap semiconductor material will produce n conductivity type in the narrower band gap semiconductor material.

Figure 1:
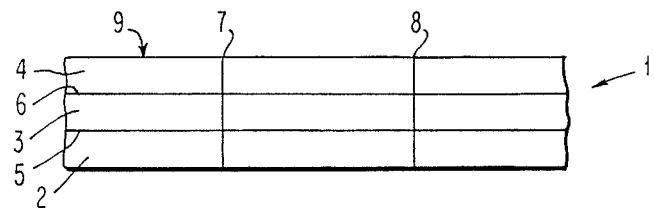
FIG. 1 is a schematic illustration of an intermediate manufacturing product involving the invention.

Such a structure may then be employed with a vertical bombardment impurity implantation technology to provide, under a masking member, a vertically aligned transistor with all regions having the same cross sectional area. The interdependent combination of the different materials with their different properties and response to the conductivity type impurity, provides process constraint relaxation and electrical performance control. Referring to FIG. 1, in the monocrystalline structure 1 there is a layer 2 of a wider band gap semiconductor material epitaxial with a layer 3 of a narrower band gap semiconductor material which in turn is epitaxial with a layer 4 at the surface of a wider band gap semiconductor material each joining the adjacent layer at heterointerfaces 5 and 6 respectively.

The layers 2 and 4 each contain a quantity of a conductivity type determining impurity providing one conductivity type whereas the layer 3 contains a quantity of the opposite conductivity type impurity.

In the regions external to the region between lines 7 and 8, there is in addition a quantity of the same conductivity type determining impurity that produces different conductivity in the wider and narrower band gap. This condition can be produced as one example by introducing the impurity through the surface 9 when the region between lines 7 and 8 was masked.

In order to facilitate explanation, the invention will be described in connection with the compound semiconductor material GaAs as the wider band gap material and the elemental semiconductor material Ge as the narrower band gap material using as the impurity a member of the group of boron, aluminum, gallium and proton (hydrogen). In the light of the principles set forth, many substitutions will be apparent to those skilled in the art.

Since the impurity is of a type that produces low conductivity in the material selected for the wider band gap material and high conductivity in material selected for the narrower band gap, the interrelationship of the structure, materials and properties are such that the introduced impurity produces a high resistivity region surrounding the region between lines 7 and 8 in the wide band gap layers 2 and 4 which may later serve as equal area emitter and collector electrodes. In such electrodes, this reduces electrical capacitance and improves wirability. In the narrower band gap layer 3, the introduced impurity in the region external to lines 7 and 8 provides the high conductivity desirable for contacts to a base region. Since all emitter, base and collector areas are equal, the resulting device is completely reversible, providing radical simplification in wiring when used in high density integrated circuits.

While the structure of FIG. 1 can be produced by a variety of techniques in standard semiconductor technology, it is particularly compatible with vertical bombardment type implantation processing, commonly referred to as ion implantation, in which the selected impurity is propelled through surface 9 around a precisely positioned mask that defines the device area, the adjacent region boundaries and depending on the material used may also serve as an external circuit terminal. The impurity is placed in the crystal 1 outside of the region between lines 7 and 8 through layers 4 and 3 and into or through 2. The region between lines 7 and 8 provides the same size regions in each layer, and each layer has device enhancing properties in the region outside of the lines 7 and 8. In layers 2 and 4 which when constructed to be the emitter and collector of a bipolar transistor the regions outside of lines 7 and 8 are high resistivity and in layer 3 when serving as the base, high conductivity is provided outside of lines 7 and 8.

BEST MODE FOR CARRYING OUT THE INVENTION

The production of a GaAs/Ge/GaAs heterojunction wide band gap emitter and collector bipolar transistor having equal area emitter, base and collector areas is illustrated in connection with the structures produced at various steps.

Figure 2:
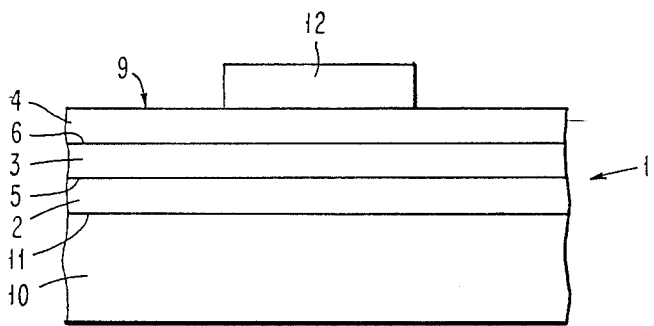
FIGS. 2-7 are schematic illustrations of the structure at points in fabrication.

Referring to FIG. 2, a schematic illustration is provided of the structure layers 2, 3 and 4 of FIG. 1 positioned on a supporting substrate 10. The substrate 10 is moderately atomic spacing compatible with GaAs, and may conveniently be high resistivity or semi-insulating GaAs thereby forming a moderately defect-free epitaxial interface 11 with the GaAs layer 2.

An ion implantation mask member 12 is positioned on the surface 9 at the location of a device. The mask 12 if made of a metal can later be used as an ohmic contact to the GaAs layer 4, such as AuGe, or an alloy of W with In as disclosed in copending application Ser. No. 06/876,063 filed June 19, 1986, is positioned on the surface 9.

While functionally in the member 1, since the layers 2 and 4 are identical, the transistor being fabricated would be reversible, one skilled in the art at this state of the art should be aware that if the technique of epitaxial growth is employed in the fabrication of the layers 2, 3 and 4, Ge grown on GaAs is reported to have higher device quality than GaAs grown on Ge so that selection of a particular layer to serve the emitter of the transistor, usually the bottom layer, may be made when the three-layer member 1 is fabricated.

Figure 3:
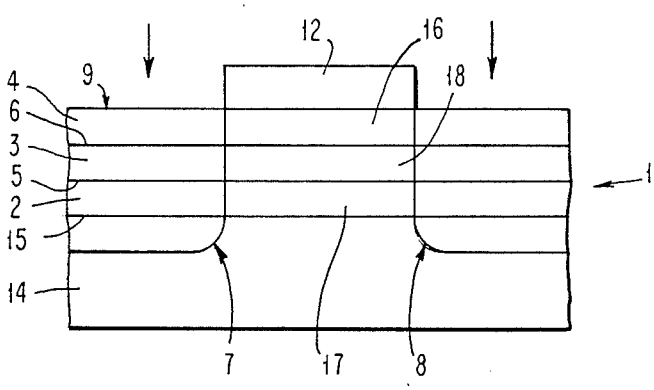

Referring next to FIG. 3, the implantation operation is shown as arrows in which a selected impurity is implanted in the regions of the member 1 surrounding the mask 12. The implantation takes place essentially vertically with respect to the surface 9 in a technique in which the impurity element is propelled under sufficient energy to penetrate into the crystal in the regions outside of and to the general depth shown by lines 7 and 8. The implantation impurity is selected with respect to the material GaAs in layers 2 and 4 to make them high resistivity or semi-insulating whereas with respect to the material Ge in layer 3, high conductivity is produced. The elements boron, aluminum, gallium and protons (hydrogen) for the material GaAs satisfies these requirements with boron preferred because boron may be activated in the Ge layer 3 with a relatively low annealing temperature of about 425° C. This annealing temperature is not sufficient to restore the conductivity of the implanted GaAs regions which remain high resistivity.

The structure at this point need only be provided with contacts to be a transistor that is symmetrical in that the GaAs regions 16 and 17 on each side of the base 18 under the mask 12 are approximately the same area which permits general interchangeability as emitter and collector, thereby simplifying later wiring of devices.

It will be apparent to one skilled in the art that a fabrication technique has been described that produces a semiconductor device in a layered crystal body with equal area electrodes, the major current path of which is essentially perpendicular with respect to the surface by converting the region of the layered crystal surrounding an aligned region that extends through the layers and then providing access to the control electrode for the current path by removal of a portion of the surface layer around the major current path electrode.

In FIGS. 4 to 7, an illustration of the contacting technique of the invention is provided.

Figure 4:
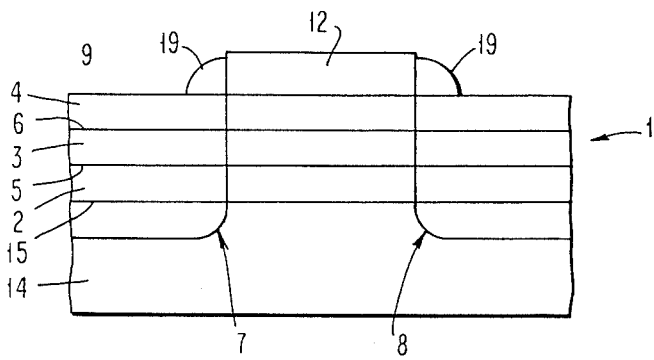

Referring next to FIG. 4, a masking material 19 capable of resisting an erosion operation of the layer 4 is placed on the surface 9 and on the sides of the mask 12. A dielectric, such as $Si_3N_4$, is satisfactory for element 19.

Figure 5:
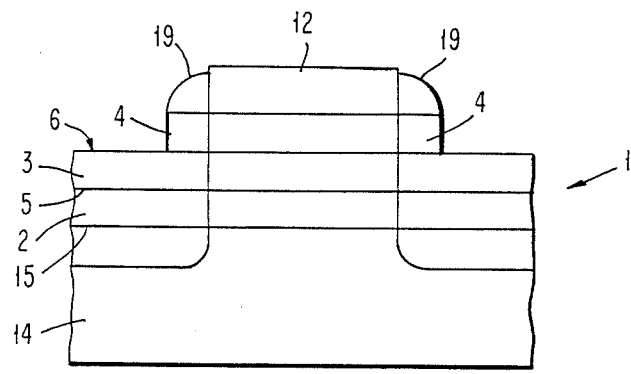

Referring next to FIG. 5, employing the dielectric element 19 as a mask, a vertical etching or erosion operation is performed through the surface 9 and layer 4 exposing the Ge layer 3 at the interface 6. This etch is facilitated by the nature of the structure of element 1 in that both reactive ion etching and chemical type etching may be readily performed down to a specific interface layer, in this case interface 6 wherein the fact that the etching properties of the GaAs and Ge materials are different is employed.

The etching operation proceeds principally in the vertical direction perpendicular to surface 9. There will, however, be some slight horizontal etching, not shown, of the dielectric 19 and the remains of the semi-insulating portions of the layer 4. Dependent on the lateral travel of the etching, the width parallel to surface 9 of the dielectric 19 is selected to retain enough of the layer 4 under dielectric 19 to serve as an insulator when an electrode is applied.

Figure 6:
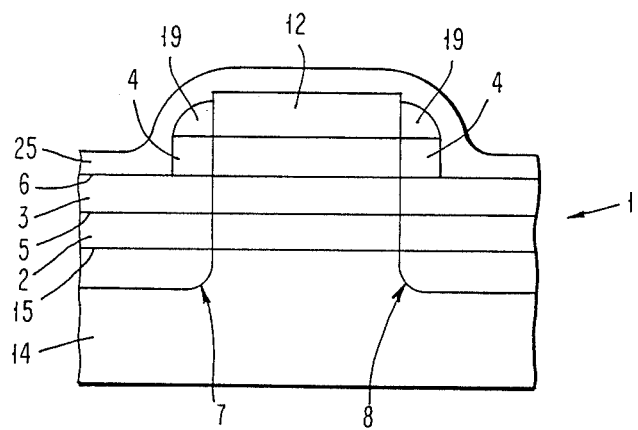

Referring next to FIG. 6, a contact metal 25, a portion of which will serve as the base contact in the final device, is deposited over the exposed layer 6, the remains of layer 4, the dielectric 19 and the metal 12.

Figure 7:
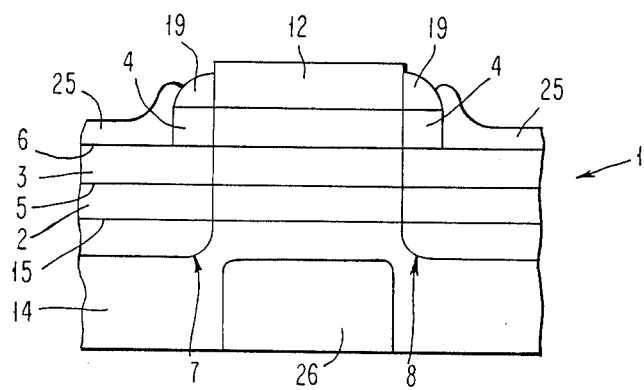

In FIG. 7, the final planarization and contact separation is accomplished by such techniques as ion milling or reactive ion etching of a portion of the metal 25. The metal 25 is removed from over the dielectric 19 and the metal 12 which then serves as an ohmic contact 12.

In the practice of the invention, variations in processing become available. Should it be useful to protect element 12 in certain types of eroding or etching operations, a titanium cap, not shown, may be placed over the metal or any portion thereof. Where desirable for precise area delineation, ion milling operations with argon-oxygen mixtures may be employed which will retain the vertical profile of element 12 even adjacent the dielectric 19. This facilitates depositing device wiring lines later when fabricating an integrated circuit.

Since the base contact metallurgy to the Ge does not require alloying, any convenient metal can be used, such as the AuGe used for element 12.

An alloy type n+GaAs ohmic contact metal member 26, again such as AuGe, is applied to the bottom of substrate 14 which then provides the third electrode, either the emitter or collector electrode, for the transistor. Should it be desirable, the region 14 can be uniformly or selectively doped to facilitate contact.

Alternatively, contact to conductive element 2 can be made adjacent to other device electrodes on the transistor surface by suitable etching operations and a conductive region provided in element 2 or 14.

The resulting transistor in FIG. 7 has the characteristics of equal area emitter, base and collector vertically oriented, electrically superior and reversible, and occupying the minimum area.

What has been described is an intermediate manufacturing product, vertical transistor and manufacturing process that provides an equal area, reduced capacitance heterojunction bipolar transistor.

Having thus described my invention, what I claim as new and desire to secure by Letters Patent is:

1. A semiconductor intermediate manufacturing product structure comprising:
   a monocrystalline body having first, second and third parallel layers of wider, narrower and wider band gaps, respectively,
   each of said first, second and third parallel layers including therein a doped region;
   said doped regions of said first, second and third regions having substantially the same cross-sectional area and being aligned to form a vertically aligned portion through said structure;
   said first, second and third regions being doped such that said first and third regions are of a first conductivity type and said second region is of a second, conductivity type;
   the portion of each said wider band gap layer outside of said aligned region being doped for high resistivity, and
   the portion of said narrower band gap layer outside said aligned region being doped for high conductivity.

2. The structure of claim 1 wherein said doping outside said aligned region is produced by a single dopant element capable of determining a low conductivity in said wider band gap semiconductor material and capable of determining a high conductivity in said narrower band gap semiconductor material.

3. The structure of claim 1 wherein said first and said third layers are GaAs and said second layer is Ge.

4. The structure of claim 3 wherein said dopant is an element taken from the group of boron, aluminum, gallium and proton (hydrogen).

5. The structure of claim 2 wherein said first and said third layers are GaAs and said second layer is Ge.

6. The structure of claim 5 wherein said dopant is an element taken from the group of boron, aluminum, gallium and proton (hydrogen).

7. A heterojunction bipolar transistor comprising:
   a monocrystalline body having first, second and third parallel layers of wider, narrower and wider band gaps respectively,
   each of said first, second and third parallel layers including therein a doped region;
   said doped regions of said first, second and third regions having substantially the same cross-sectional area and being aligned to form a vertically aligned portion through said structure;
   said first, second and third regions being doped such that said first and third regions are of a first conductivity type and said second region is of a second, conductivity type;
   the portion of said body outside said aligned portion defining, in said first and third layers, a region of high resistivity, and in said second layer a region of high conductivity,
   at least one ohmic contact to the portion of said second layer in said portion outside said aligned portion separated from said aligned portion by a portion of said first layer,
   an ohmic contact to said first layer in said aligned portion, and
   an ohmic contact to said third layer.

8. The transistor of claim 7 wherein a single impurity element provides, in the region outside the aligned region, high resistivity in said first and third layers and high conductivity in said second layer.

9. The transistor of claim 7 wherein said first and third layers are GaAs and said second layer is Ge.

10. The transistor of claim 9 wherein a single impurity element provides in the region outside the aligned region, high resistivity in said first and third layers and high conductivity in said second layer.

11. The transistor of claim 10 wherein said impurity element is taken from the group of boron, aluminum, gallium and proton (hydrogen).

* * * * *